(12) United States Patent
Grossman et al.

(10) Patent No.: US 10,788,811 B2
(45) Date of Patent: Sep. 29, 2020

(54) AUTOMATED TECHNIQUES FOR GENERATING ENCLOSURES FOR DEVICES

(71) Applicant: AUTODESK, INC., San Rafael, CA (US)

(72) Inventors: Tovi Grossman, Toronto (CA); George Fitzmaurice, Toronto (CA); Fraser Anderson, Camrose (CA); Raf Ramakers, Hassett (BE)

(73) Assignee: AUTODESK, INC., San Rafael, CA (US)

( * ) Notice: Subject to any disclaimer, the term of this patent is extended or adjusted under 35 U.S.C. 154(b) by 793 days.

(21) Appl. No.: 15/406,629

(22) Filed: Jan. 13, 2017

(65) Prior Publication Data
US 2017/0206285 A1 Jul. 20, 2017

Related U.S. Application Data

(60) Provisional application No. 62/279,594, filed on Jan. 15, 2016.

(51) Int. Cl.
*G06F 30/00* (2020.01)
*G05B 19/4099* (2006.01)
(Continued)

(52) U.S. Cl.
CPC .......... *G05B 19/4097* (2013.01); *B33Y 50/00* (2014.12); *G05B 19/4099* (2013.01);
(Continued)

(58) Field of Classification Search
CPC ............ G05B 19/4097; G05B 19/4099; G05B 2219/49007; G05B 2219/35134; G06F 17/50; G06F 30/00; B33Y 50/00
(Continued)

(56) References Cited

U.S. PATENT DOCUMENTS 7,283,884 B2 10/2007 Walters
7,500,237 B1 3/2009 Saiyed et al.
(Continued)

OTHER PUBLICATIONS

Weichel et al., "Enclosed: a component-centric interface for designing prototype enclosures", 2013, Proceedings of the 7th International Conference on Tangible, Embedded and Embodied Interaction, ACM, pp. 1-4.*

(Continued)

*Primary Examiner* — Juan C Ochoa
(74) *Attorney, Agent, or Firm* — Artegis Law Group, LLP (57) ABSTRACT

In one embodiment, an enclosure generator automatically generates an enclosure for a device based on a three-dimensional (3D) model of a target surface and component instances that are associated with different positions within the device. In operation, the enclosure generator computes a surface region based on the target surface and the component instances. Subsequently, the enclosure generator computes a front panel model and a back structure model based on the surface region. Notably, the back structure model includes support structure geometries. Together, the front panel model and the back structure model comprise an enclosure model. The enclosure generator then stores the enclosure model or transmits the enclosure model to a 3D fabrication device. Advantageously, unlike conventional, primarily manual approaches to enclosure generation, the enclosure generator does not rely on the user possessing any significant technical expertise.

20 Claims, 7 Drawing Sheets

(51) Int. Cl.
  *G05B 19/4097* (2006.01)
  *B33Y 50/00* (2015.01)
(52) U.S. Cl.
  CPC .... *G06F 30/00* (2020.01); *G05B 2219/35134* (2013.01); *G05B 2219/49007* (2013.01)
(58) Field of Classification Search
  USPC .......................................................... 703/1
  See application file for complete search history.

(56) References Cited

U.S. PATENT DOCUMENTS

| | | | | |
|---|---|---|---|---|
| 8,116,076 | B2* | 2/2012 | Cochrane | G06F 1/182 312/223.2 |
| 2009/0085500 | A1 | 4/2009 | Zampini et al. | |
| 2013/0268639 | A1 | 10/2013 | Myrah et al. | |
| 2014/0253548 | A1* | 9/2014 | Schmidt | G06T 17/10 345/420 |
| 2015/0106061 | A1 | 4/2015 | Yang et al. | |

OTHER PUBLICATIONS

Savage et al., "Makers' Marks: Physical Markup for Designing and Fabricating Functional Objects", 2015, Proceedings of the 28th Annual ACM Symposium on User Interface Software & Technology, ACM, pp. 103-108.*

Weichel et al., "MixFab: a mixed-reality environment for personal fabrication", 2014, Proceedings of the SIGCHI Conference on Human Factors in Computing Systems, ACM, pp. 1-10.*

Teibrich et al., Patching Physical Objects, 2015, Proceedings of the 28th Annual ACM Symposium on User Interface Software & Technology, pp. 83-91.*

Scott Davidoff et al., Mechanical Hijacking: How Robots Can Accelerate UbiComp Deployments, 2011, Proceedings of the 13th international conference on Ubiquitous computing, ACM, pp. 267-270.*

Petrelli et al., "Prototyping tangibles: exploring form and interaction", Feb. 16-19, 2014, TEI'14 Munich, Germany, pp. 41-48.*

* cited by examiner

AUTOMATED TECHNIQUES FOR GENERATING ENCLOSURES FOR DEVICES

CROSS-REFERENCE TO RELATED APPLICATIONS

This application claims the priority benefit of the U.S. Provisional Patent Application having Ser. No. 62/279,594 and filed on Jan. 15, 2016. The subject matter of this related application is hereby incorporated herein by reference.

BACKGROUND OF THE INVENTION

Field of the Invention

Embodiments of the present invention relate generally to computer processing and, more specifically, to automated techniques for generating enclosures for devices.

Description of the Related Art

Decreases in prices and increases in the availability of electronics have led to a proliferation of "smart" devices. Smart devices implement more powerful and flexible functionality and/or connectivity than "legacy" devices. For example, a smart thermostat can be configured to control a heating system based on sensor inputs or via a smartphone. By contrast, legacy thermostats are typically configured to control a heating system based on only a single temperature setting that is entered manual via control buttons situated on the thermostat. Although many users would benefit from the additional functionality and connectivity that come with smart devices, users oftentimes do not replace functioning legacy devices with smart devices for various practical or emotional reasons, such as the cost of purchasing the smart devices, the time and effort to replace the legacy devices, and/or emotional attachments to the legacy devices, to name a few. Instead, in many instances, users attempt to retrofit their legacy devices to enable the legacy device to implement additional or different functionality or connectivity.

To retrofit a given legacy device, a user typically designs a proxy interface that provides the desired functionality and connectivity when attached to the legacy device. For example, the proxy interface could include actuators that are configured to manipulate legacy controls based on inputs that are received from a smartphone. One drawback of this approach, however, is that designing a proxy interface is typically a complex, multi-step process. First, the user has to define the high-level behavior for the proxy interface. The user then has to identify and purchase multiple component instances, such as sensors, actuators, microcontrollers, etc. Subsequently, the user has to design and manufacture an enclosure that houses the component instances and, when attached to the legacy device, enables the component instances to manipulate the legacy controls to execute the desired high-level behavior. Lastly, the user has to assemble the component instances into a circuit. In addition, if the proxy interface includes a programmable instance, like a microcontroller, then the user has to write, compile and upload the firmware used to control the operation of the circuit through the programmable instance.

As the foregoing illustrates, designing a proxy interface requires significant knowledge across a range of technical areas, such as enclosure design and fabrication, circuit design, and programming. A lack of knowledge in one or more of these areas can discourage a user from attempting to retrofit a legacy device. Further, because the design and assembly process involves many different, manual operations, designing proxy interfaces can be tedious and time consuming, irrespective of the technical expertise of the user.

As the foregoing illustrates, what is needed in the art are more effective techniques for retrofitting legacy devices with new features and functionalities.

SUMMARY OF THE INVENTION

One embodiment of the present invention sets forth a computer-implemented method for generating an enclosure for a device. The method includes computing a surface region based on a target surface model and one or more component instances, where each component instance is associated with a different position within the device; generating a front panel model based on the surface region; generating a back structure model based on the surface region and the one or more component instances, where the back structure model includes one or more support structure geometries; and storing the front panel model and the back structure model or transmitting the front panel model and the back structure model to a three-dimensional (3D) fabrication device.

One advantage of the disclosed techniques is that users with limited or no knowledge of enclosure design and fabrication may effectively design an enclosure for a device. Further, the disclosed techniques facilitate a comprehensive, automated design process for retrofitting a legacy device based on a three-dimensional model of the legacy device. Notably, the time required to generate and design the enclosure is substantially reduced compared to the time that would be required to generate the enclosure based on conventional, primarily manual approaches.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skilled in the art that the present invention may be practiced without one or more of these specific details.

System Overview

Figure 1:
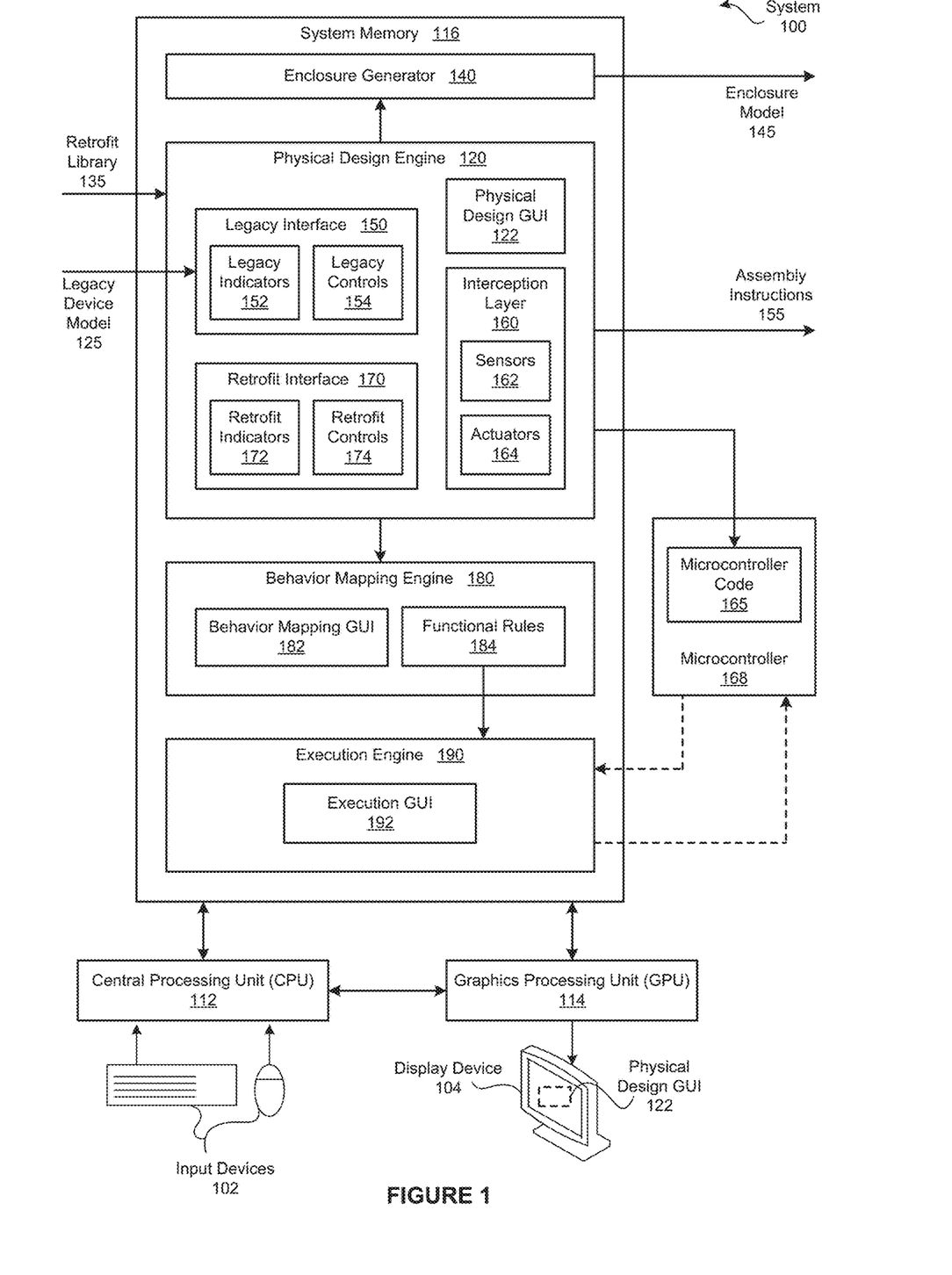
FIG. 1 is a conceptual illustration of a system configured to implement one or more aspects of the present invention.

FIG. 1 is a conceptual illustration of a system 100 configured to implement one or more aspects of the present invention. As shown, the system 100 includes, without limitation, a central processing unit (CPU) 112, input devices 102, a graphics processing unit (GPU) 114, a display device 104, and a system memory 116. For explanatory purposes, multiple instances of like objects are denoted with reference numbers identifying the object and parenthetical numbers identifying the instance where needed.

The CPU 112 receives input user input from the input devices 102, such as a keyboard or a mouse. In operation, the CPU 112 is the master processor of the system 100, controlling and coordinating operations of other system components. In particular, the CPU 112 issues commands that control the operation of the GPU 114. The GPU 114 incorporates circuitry optimized for graphics and video processing, including, for example, video output circuitry. The GPU 114 delivers pixels to the display device 104 that may be any conventional cathode ray tube, liquid crystal display, light-emitting diode display, or the like.

In various embodiments, GPU 114 may be integrated with one or more of other elements of FIG. 1 to form a single system. For example, the GPU 114 may be integrated with the CPU 112 and other connection circuitry on a single chip to form a system on chip (SoC). In alternate embodiments, the CPU 112 and/or the GPU 114 may be replaced with any number of processors. Each of the processors may be any instruction execution system, apparatus, or device capable of executing instructions. For example, a processor could comprise a digital signal processor (DSP), a controller, a microcontroller, a state machine, or any combination thereof.

The system memory 116 stores content, such as software applications and data, for use by the CPU 112 and the GPU 114. The system memory 116 may be any type of memory capable of storing data and software applications, such as a random access memory (RAM), a read-only memory (ROM), an erasable programmable read-only memory (EPROM or Flash ROM), or any suitable combination of the foregoing. In some embodiments, a storage (not shown) may supplement or replace the system memory 116. The storage may include any number and type of external memories that are accessible to the CPU 112 and/or the GPU 114. For example, and without limitation, the storage may include a Secure Digital Card, an external Flash memory, a portable compact disc read-only memory (CD-ROM), an optical storage device, a magnetic storage device, or any suitable combination of the foregoing.

It will be appreciated that the system 100 shown herein is illustrative and that variations and modifications are possible. The number of CPUs 112, the number of GPUs 114, the number of system memories 116, and the number of applications included in the system memory 116 may be modified as desired. Further, the connection topology between the various units in FIG. 1 may be modified as desired. In some embodiments, any combination of the CPU 112, the GPU 114, and the system memory 116 may be replaced with any type of distributed computer system or cloud computing environment, such as a public or a hybrid cloud.

In general, the system 100 enables users to retrofit their "legacy" devices to generate "retrofit" devices that implement additional functionality or connectivity. As persons skilled in the art will recognize, conventional approaches to retrofitting legacy devices typically require significant knowledge across a range of technical areas, such as enclosure design and fabrication, circuit design, and programming. A lack of knowledge in one or more of these areas can discourage a user from attempting to retrofit a legacy device. Further, because the design and assembly process involves many different, manual operations, generating retrofit devices can be tedious and time consuming, irrespective of the technical expertise of the user.

Automatically Retrofitting Legacy Devices

To enable user with relatively little or no relevant technical knowledge to efficiently design and manufacture retrofit devices, the system memory 116 includes, without limitation, a physical design engine 120, an enclosure generator 140, a behavior mapping engine 180, and an execution engine 190. As shown, the physical design engine 120 includes a physical design graphical user interface (GUI) 122, a legacy interface 150, a retrofit interface 170, and an interception layer 160. In operation, the physical design engine 120 generates the physical design GUI 122 and configures the display device 104 to display the physical design GUI 122. Initially, the physical design GUI 122 enables the user to provide a legacy device model 125.

In general, as referred to herein, a "model" comprises any three-dimensional (3D) model that digitally represents an object and may conform to any 3D modeling format as known in the art. For example, a model may comprise a 3D mesh of interconnected triangles that digitally represents an object. In another example, a model may comprise normal and vertices that define an object in the stereolithograpy format. In particular, the legacy device model 125 is a 3D model of the legacy device and may be generated in any technically feasible fashion. For example, in some embodiments, to 3D scanner generates the legacy device model 125.

Upon receiving the legacy device model 125, the physical design engine 120 configures the physical design GUI 122 to display the legacy device model 125 and a set of tools that enable the user to specify the legacy interface 150. The legacy interface 150 includes, without limitation, any number of legacy indicators 152 and any number of legacy controls 154. For explanatory purposes, the legacy indicators 152 and the legacy controls 154 are also referred to herein as "the legacy interface instances." Each of the legacy interface instances is associated with a legacy interface component and a configuration. As referred to herein, a "configuration" is a position and an orientation. As part of specifying each of the legacy interface instances, the user also specifies the associated legacy interface component and configuration.

The legacy indicators 152 are the outputs of the legacy device, such as light emitting diodes (LEDs), By contrast the legacy controls 154 are inputs to the legacy device, such as buttons, sliders, and switches, to name a few. The physical design GUI 122 may enable the user to specify the legacy interface instances in any technically feasible fashion. For instances, in some embodiments, the physical design GUI 122 provides a set of brushes, where each brush is associated with a different legacy interface component. To comprehensively identify a legacy interface instance, the user highlights the displayed legacy interface instance with the proper brush. In alternate embodiments, the physical design engine 120 may implement image recognition algorithms to automatically identify the legacy interface instances.

After the physical design engine 120 identifies the legacy interface 150, the physical design engine 120 generates the retrofit interface 170 and the interception layer 160. The retrofit interface 170 includes, without limitation, any number of retrofit indicators 172 and any number of retrofit controls 174. The interception layer 160 includes, without limitation, any number of sensors 162 and any number of actuators 164. For explanatory purposes, the retrofit indicators 172 and the retrofit controls 174 are also referred to herein as "the retrofit interface instances." In a complementary fashion, the sensors 162 and the actuators 164 are referred to herein as the "interception instances." Further, the retrofit interface instances and the interception instances are also referred to herein as the "retrofit component instances."

Each of the retrofit component instances is associated with a retrofit component and a configuration. The retrofit components are defined in a retrofit library 135. For each retrofit component, the retrofit library 135 also includes a corresponding component housing model that enables the enclosure generator 140 to integrate the retrofit component instance into an enclosure model 145. The retrofit library 135 may be generated and transmitted to the physical design engine 120 and the enclosure generator 140 in any technically feasible fashion. The retrofit library 135 is also referred to herein as a "component library."

For each of the legacy indicators 152, the physical design engine 120 generates an corresponding sensor 162 that is designed to intercept any output from the legacy indicator 152. Notably, the physical design engine 120 selects an appropriate type of sensor 162, an appropriate position relative to the legacy indicator 152, and an appropriate orientation relative to the legacy indicator 152. In addition, the physical design engine 120 generates a corresponding retrofit indicator 172. The physical design engine 120 selects the type, position, and orientation of the retrofit indicator 172 to mirror the legacy indicator 152. For example, if the legacy indicator 152 is an LED, then the physical design engine 120 selects a light sensor as the corresponding actuator 164 and an LED as the corresponding retrofit indicator 152. Further, the physical design engine 120 aligns the light sensor and the retrofit LED with the legacy LED.

Similarly, for each of the legacy controls 154, the physical design engine 120 generates a corresponding retrofit control 174 that mirrors the legacy control 154 and a corresponding actuator 164 that is designed to redirect any input from the retrofit control 174 to the legacy control 154. The physical design engine 120 selects an appropriate type of actuator as the actuator 164, an appropriate position relative to the legacy control 154, and an appropriate orientation relative to the legacy control 154. For example, if the legacy control 154 is a pushbutton or a lever, then the physical design engine 120 selects a linear actuator as the associated actuator 164. By contrast, if the legacy control 154 is a dial, then the physical design engine 120 selects a stepper motor.

The physical design engine 120 then configures the physical design GUI 122 to display the legacy interface 150, the retrofit interface 170, and the interception layer 160 as well as a set of tools that allow the user to modify the retrofit interface 170 and the interception layer 160. For example, the user could reposition or delete any of the actuators 164, the sensors 162, the retrofit indicators 172, and the retrofit controls 174. Further, the user could add new actuators 164, new sensors 162, new retrofit indicators 172, and/or new retrofit controls 174. Finally, the user could replace any of the actuators 164, the sensors 162, the retrofit indicators 172, and the retrofit controls 174 with different retrofit component instances.

The physical design engine 120 transmits the legacy device model 125, the interception layer 150, and the retrofit interface 170 to the enclosure generator 140. As described in detail in FIGS. 4-6, the enclosure generator 140 generates the enclosure model 145 for a physical enclosure that is customized to provide housing and support for the retrofit component instances. The enclosure model 145 specifies a front panel, a back structure, and a mounting bracket. The front panel houses the retrofit interface instances. The back structure houses the interception instances as well as support structures that ensure that the interception instances do not change position or orientation. The mounting bracket is designed to mount the enclosure to the legacy device.

In alternate embodiments, the physical design engine 120 transmits the enclosure model 145 to an automated manufacturing tool, such as a 3D printer. In some embodiments, the enclosure generator 140 may be implemented as a stand-alone application and be stored in a different memory and/or execute on a different processor or a different device than the physical design engine 120. Further, the enclosure generator 140 may be configured to automatically generate enclosures for any type of device that encloses any number and type of component instances. In various embodiments, the enclosure generator 140 may include any type of GUI or may interface with the physical design GUI 122.

After the enclosure generator 140 generates the enclosure model 145, the physical design engine 120 executes a pin assignment algorithm that assign the control pins of each of the retrofit component instances to compatible pins of a microcontroller 168 that is included in the retrofit device. The physical design engine 120 may implement any technically feasible pin assignment algorithm. For instance, in some embodiments, the physical design engine 120 attempts to select a pin assignment that maximizes the number of the retrofit component instances that can be connected to the pins on the microcontroller 168.

After the physical design engine 120 completes the pin assignments, the physical design engine 120 generates microcontroller code 165 that configures the microcontroller 168 to communicate between the execution engine 190 and the retrofit component instances. In particular, the microcontroller 168 communicates the states of the sensors 162 and the retrofit controls 174 to the execution engine 190. In a complementary fashion, the microcontroller 168 controls the actuators 164 and the retrofit indicators 172 based on commands received from the execution engine 190. The microcontroller 168 may communicate with the execution engine 190 in any technically feasible fashion.

The microcontroller 168 may be any type of microcontroller. For example, the microcontroller 168 could be an "Arduino® UNO" and an "Arduino® UNO® Wi-Fi," In alternate embodiments, the microcontroller 168 may be replaced with any type of programmable instance, and the physical design engine 120 may configure the programmable instance in any technically feasible fashion. Further, in some embodiments, the user may select the programmable instance that is included in the retrofit device.

Finally, the physical design engine 120 generates assembly instructions 155 that specify how to connect the pins of the microcontroller 168 to the pins of the retrofit component instances. The physical design engine 120 then configures the physical design GUI 122 to display the assembly instructions 155. Together, the enclosure model 145, the microcontroller code 168, and the assembly instructions 155 enable users without any significant technical knowledge to generate a physical retrofit device that includes an enclosure, the retrofit component instances, the microcontroller 168, and the legacy device.

The behavior mapping engine 180 customizes the behavior of the retrofit device. As shown, the behavior mapping engine 180 includes, without limitation, a behavior mapping GUI 182 and functional rules 184. Each of the functional rules 184 specifies a relationship between one or more input sequence of actions and one or more output sequences of actions. The behavior mapping engine 180 may support any number and type of functional rules 184, such as a causal (if-then) rules, linear regression (map-to) rules, etc., in any technically feasible fashion. Initially, the behavior mapping engine 180 generates default functional rules 184. The default functional rules 184 specify that each of the retrofit indicators 172 mirrors the behavior of a corresponding legacy indicator 152. Similarly, the default function rules 184 specify that each of the retrofit controls 174 mirrors the behavior of the corresponding legacy control 172.

The behavior mapping engine 180 configures the behavior mapping GUI 182 to graphically depict a 3D model of the retrofit device that includes the enclosure model 145, models of the retrofit component instances, and the legacy device model 125. In general, the behavior mapping engine 180 implements programming-by-demonstration techniques that enable the user to specify behaviors based on interacting with the graphical depiction of the retrofit device. A user demonstrates actions directly on top of the models of the retrofit component instances and can record relationships between sequences of one or more actions.

Notably, the behavior mapping engine 180 may display the 3D models associated with multiple retrofit devices, and the user may specify relationships between different retrofit devices. For example, the user could specify that when a retrofitted alarm clock begins to buzz, a retrofitted coffee maker turns on. After the user records a relationship between one or more input sequence of actions and one or more output sequences of actions, the behavior mapping engine 180 generate one or more corresponding functional rules 184.

After the behavior mapping engine 180 generates the functional rules 184, the behavior mapping engine 180 transmits the functional rules 184 to the execution engine 190. As shown, the execution engine 190 includes an execution GUI 192. The execution engine 190 configures the execution GUI 192 to graphically depict 3D models of the available retrofit devices. The execution engine 190 interprets user actions entered via a model of a retrofit device as though the user entered the user actions on the physical retrofit device. For example, the user could press a retrofit control 174 included in the 3D model of a retrofitted oven to preheat the oven remotely. In alternate embodiments, a remote application may display the execution GUI 192 to enable the user to remotely control retrofit devices from any device capable of executing the remote application. (e.g., a smartphone).

As the retrofit devices operates, the execution engine 190 receives the states of the retrofit component instances and processes the states based on the functional rules 184 to generate commands. The execution engine 190 then transmits the commands the microcontroller 168 to control the retrofit component instances. Advantageously, the execution engine 190 may control any number of retrofit devices at any given time.

In alternate embodiments, the system memory 116 may not include the physical design engine 120, the enclosure generator 140, the behavior mapping engine 180, and/or the execution engine 192. In some embodiments, the physical design engine 120, the enclosure generator 140, the behavior mapping engine 180, and/or the execution engine 192 may be stored on computer readable media such as a CD-ROM, DVD-ROM, flash memory module, or other tangible storage media. Further, in some embodiments, the physical design engine 120, the enclosure generator 140, the behavior mapping engine 180, and/or the execution engine 192 may be provided as an application program (or programs) stored on computer readable media such as a CD-ROM, DVD-ROM, flash memory module, or other tangible storage media.

In various embodiments, the functionality of the physical design engine 120, the enclosure generator 140, the behavior mapping engine 180, and/or the execution engine 192 is integrated into or distributed across any number (including one) of software applications. Further, in some embodiments, each of the physical design engine 120, the enclosure generator 140, the behavior mapping engine 180, and/or the execution engine 192 may execute on different computing systems. The physical design engine 120, the enclosure generator 140, the behavior mapping engine 180, and the execution engine 192 as described herein are not limited to any particular computing system and may be adapted to take advantage of new computing systems as they become available.

Figure 2:
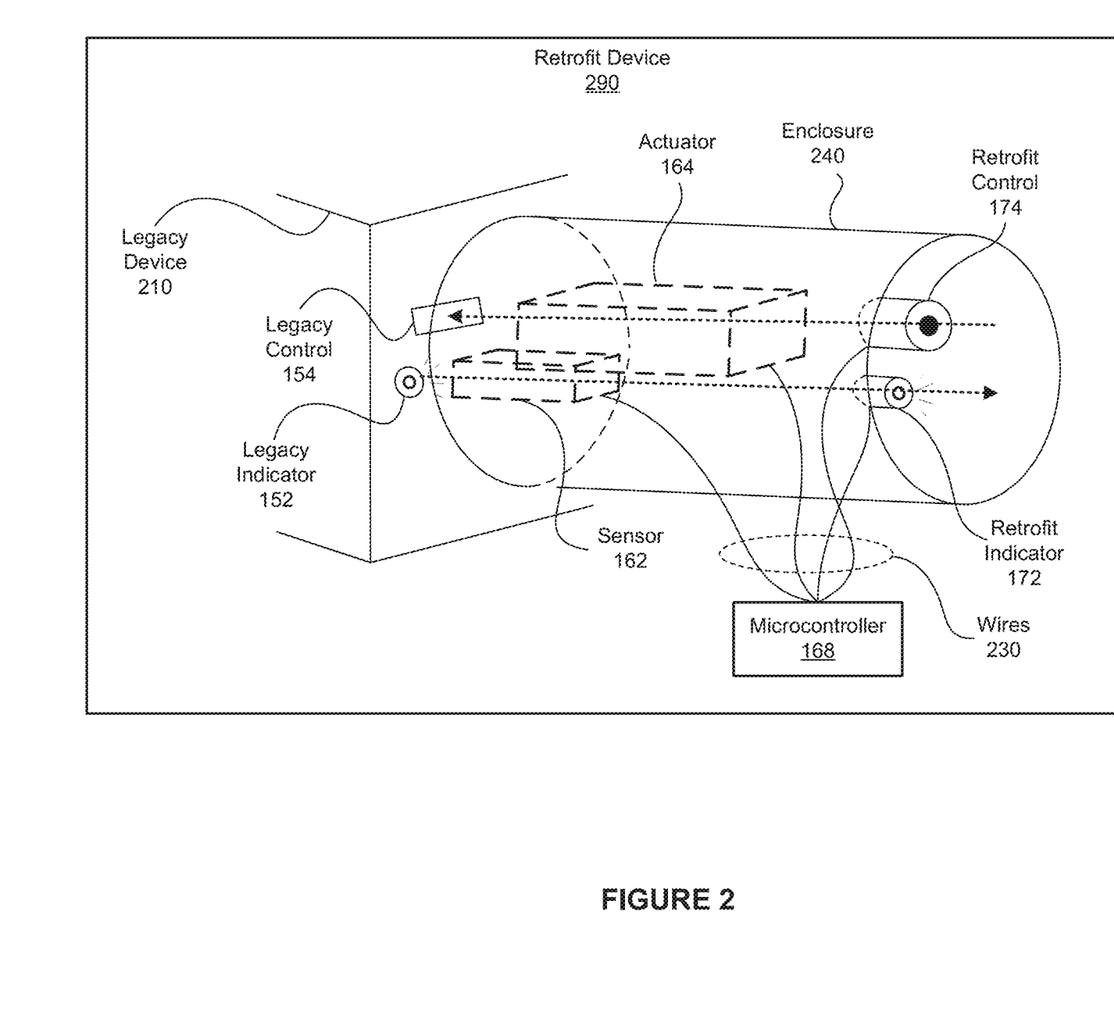
FIG. 2 is an example of a retrofit device generated via the physical design engine of FIG. 1, according to various embodiments of the present invention.

FIG. 2 is an example of a retrofit device 290 generated via the physical design engine 120 of FIG. 1, according to various embodiments of the present invention. As shown, the retrofit device 290 includes, without limitation, the legacy device 210, the enclosure 240, and the microcontroller 168. The legacy device 210 includes the legacy indicator 152 and the legacy control 154. The sensor 162 and the actuator 164 are inside the enclosure 240 and aligned with, respectively, the legacy indicator 152 and the legacy control 154. The retrofit indicator 172 and the retrofit control 174 are housed at the boundary of the enclosure 240 and, consequently, are visible to the user. As shown, the microcontroller 168 is connected to the retrofit component instances via wires 230.

Figure 3A:
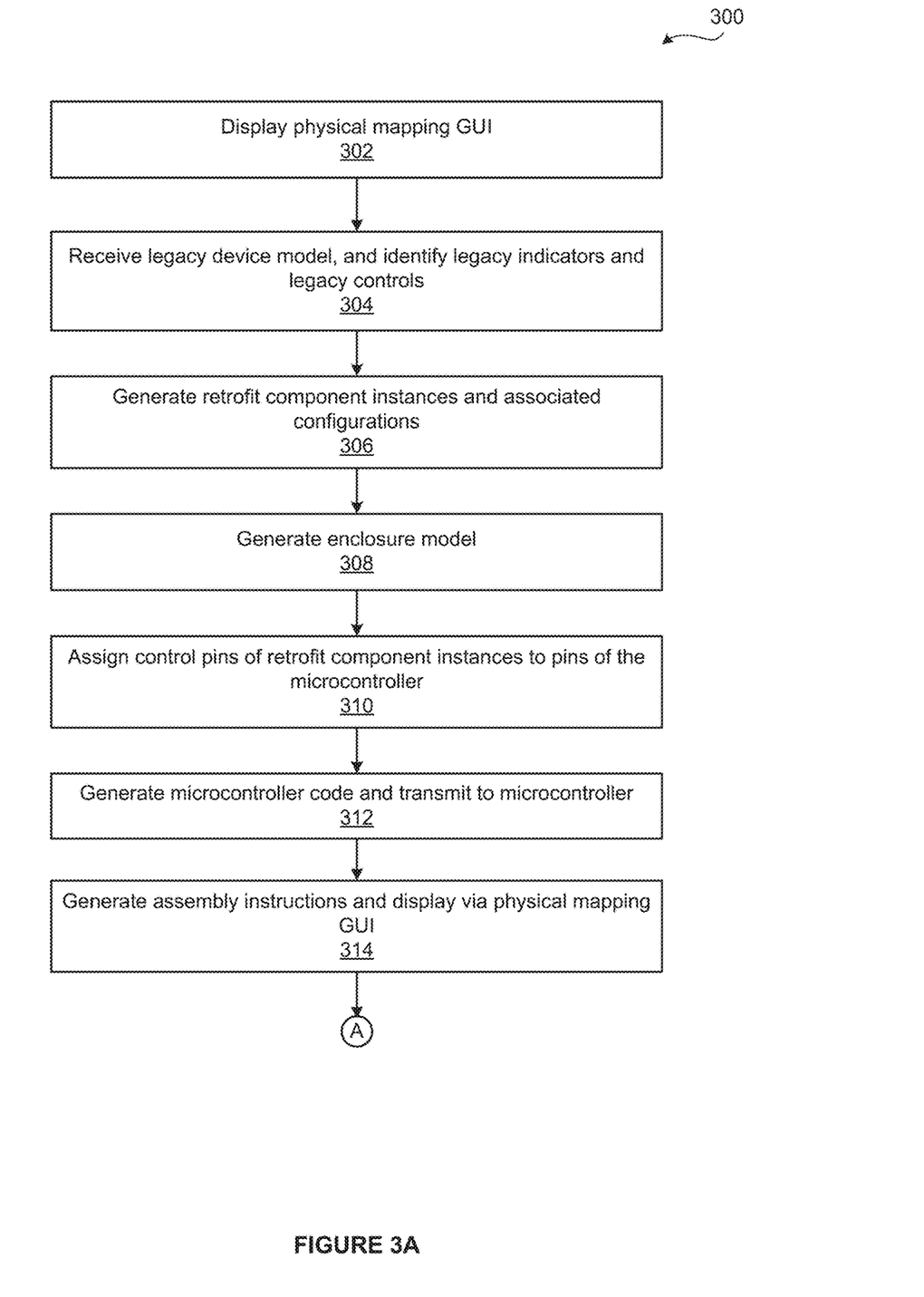
FIGS. 3A and 3B set forth a flow diagram of method steps for automatically retrofitting a legacy device, according to various embodiments of the present invention.
Figure 3B:
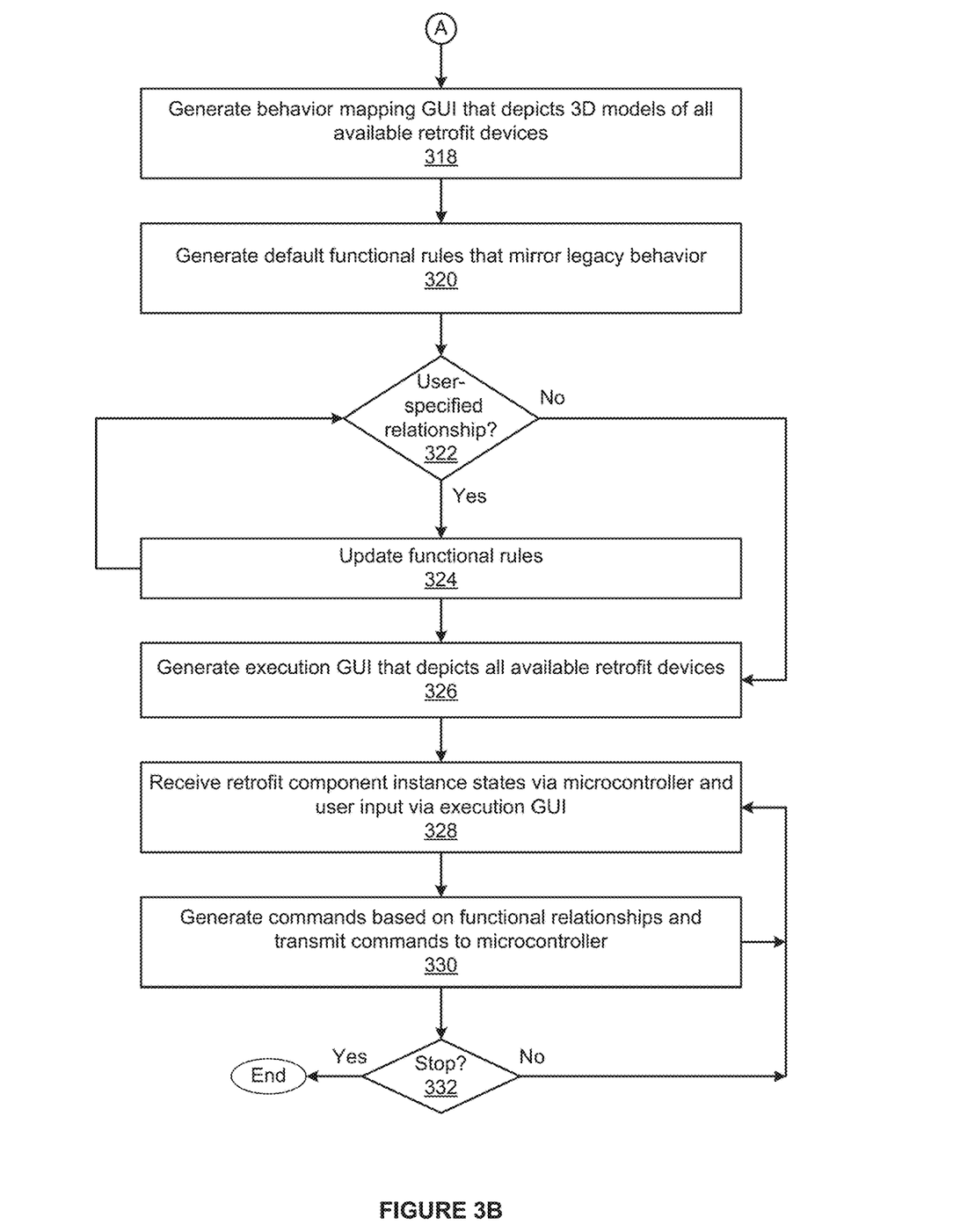

FIGS. 3A and 3B set forth a flow diagram of method steps for automatically retrofitting a legacy device, according to various embodiments of the present invention. Although the method steps are described with reference to the systems of FIGS. 1-2, persons skilled in the art will understand that any system configured to implement the method steps, in any order, falls within the scope of the present invention.

As shown, a method 300 begins at step 302, where the physical design engine 120 displays the physical design GUI 122 on the display device 104. At step 304, the physical design engine 120 receives the legacy device model 125 and identifies the legacy indicators 152 and the legacy controls 154. At step 306, the physical design engine 120 generates the retrofit component instances based on the legacy indicators 152 and the legacy controls 154. At step 308, the enclosure generator 140 generates the enclosure model 145.

At step 310, the physical design engine 120 assigns the control pins of the retrofit component instances to pins of the microcontroller 168. At step 312, the physical design engine 120 generates the microcontroller code 165 based on the pin assignments and transmits the microcontroller code 165 to the microcontroller 168. At step 314, the physical design engine 120 generates the assembly instructions 155 for the retrofit device 290 based on the pin assignments, and configures the physical display GUI 122 to display the assembly instructions 155 for the retrofit device 290 via the display device 104.

At step 318, the behavior mapping engine 180 generates the behavior mapping GUI 182 that graphically depicts a 3D model of the retrofit device 290 as well as 3D models of any other available retrofit devices 290. As step 320, the behavior mapping engine 180 generates default functional rules 184. The default functional rules 184 specify that each of the retrofit indicators 172 mirrors the behavior of a corresponding legacy indicator 152. Similarly, the default functional rules 184 specify that each of the retrofit controls 174 mirrors the behavior of the corresponding legacy control 172.

At step 322, the behavior mapping engine 180 determines whether the behavior mapping engine 180 has received a new user-specified relationship via the behavior mapping GUI 182. If, at step 322, the behavior mapping engine 180 determines that the behavior mapping engine 180 has received a new user-specified relationship, then the method 300 proceeds to step 324. At step 324, the behavior mapping engine 180 updates the functional rules 184 based on the user-specified relationship. The method 300 then returns to step 322, where the behavior mapping engine 180 determines whether the behavior mapping engine 180 has received a new user-specified relationship. If, however, at step 322, the behavior mapping engine 180 determines that the behavior mapping engine 180 has not received a new user-specified relationship, then the method 300 proceeds directly to step 326.

At step 326, the execution engine 190 generates the execution GUI 192 that that graphically depicts a 3D model of the retrofit device 290 as well as 3D models of any other available retrofit devices 290. At step 328, the execution engine 190 receives the states of the retrofit component instances via the microcontroller 168 and user input via the execution GUI 192. At step 330, the execution engine 190 computes commands based on the functional rules 184, the states, and the user input. The execution engine 190 transmits the commands to the microcontroller 168.

At step 332, the execution engine 190 determines whether the execution engine 190 is to stop operating. The execution engine 190 may determine whether the execution engine 190 is to stop operating in any technically feasible fashion. For example, the execution engine 190 could determine whether the execution engine 190 has received an "end" command. If, at step 332, the execution engine 190 determines that the execution engine 190 is to continue operating, then method 300 then returns to step 328, where the execution engine 190 receives new inputs. The execution engine 190 continues to cycle through steps 328-332, controlling the retrofit device 290 to implement the behaviors specified in the functional rules 184, until the execution engine 190 determines that the execution engine 190 is to stop operating. If, however, at step 332, the execution engine 190 determines that the execution engine 190 is to stop executing, then the execution engine 190 stops operating, and the method 300 terminates.

Automatically Generating Enclosures

Figure 4:
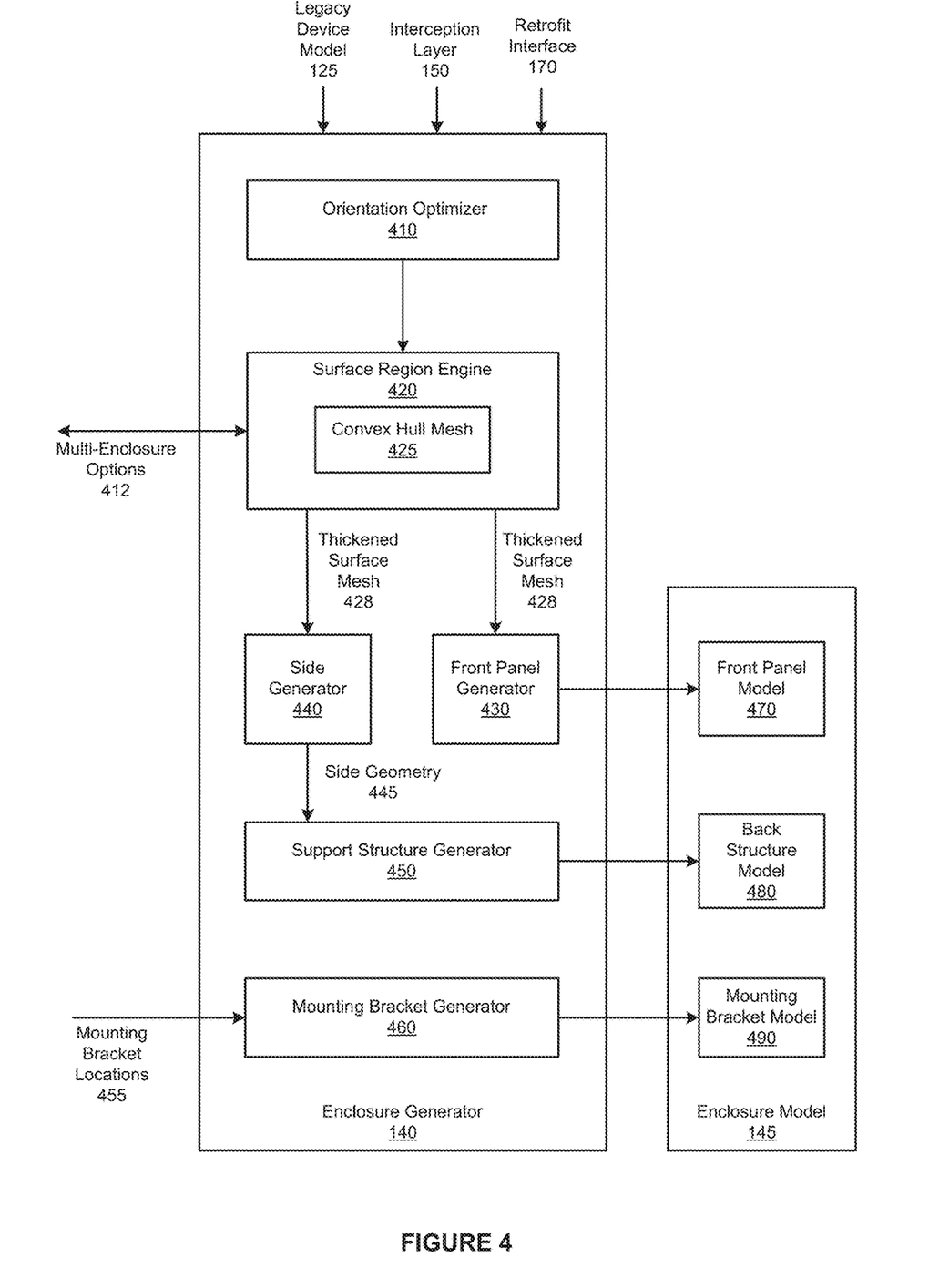
FIG. 4 is a more detailed illustration of the enclosure generator of FIG. 1, according to various embodiments of the present invention.

FIG. 4 is a more detailed illustration of the enclosure generator 140 of FIG. 1, according to various embodiments of the present invention. As shown, the enclosure generator 140 includes, without limitation, an orientation optimizer 410, a surface region engine 420, a front panel generator 430, a side generator 440, a support structure generator 450, and a mounting bracket generator 460. The enclosure generator 140 receives the legacy device model 125, the interception layer 150, and the retrofit interface 170. Together, the interception layer 150 and the retrofit interface 170 include the retrofit component instances. As described previously herein, each of the retrofit component instances is associated with a component housing model and a configuration (i.e., a position and orientation).

As shown, the enclosure generator 140 generates the enclosure model 145. The enclosure model 145 includes, without limitation, a front panel model 470, a back structure model 480, and a mounting bracket model 490. The front panel model 470 includes component housing models that are associated with the retrofit indicators 172 and the retrofit controls 174. In a complementary fashion, the back structure model 480 includes component housing models that are associated with the sensors 162 and the actuators 164. The mounting bracket model 490 specifies feet (not shown in FIG. 4) that conform to the surface curvatures of the legacy device model 125 at mounting bracket locations 455.

The orientation optimizer 410 eliminates any overlaps between the actuators 164 and the sensors 162. If the orientation optimizer 410 detects one or more overlaps between the component housing models that are associated with the actuators 164 and the sensors 162, then the orientation optimizer 410 attempts to automatically reduce the overlaps via an orientation optimization process. For each of the intersecting component housing models, the orientation optimizer 410 rotates the associated actuator 164 or sensor 162 around a normal vector of the associated region of the legacy device model 125. If the orientation optimizer 410 is unable to automatically eliminate the overlaps, then the orientation optimizer 410 prompts the user to adjust the position and/or orientation of the intersecting actuators 164 and/or sensors 162.

In general, to customize the enclosure 240 to the legacy device 210, the enclosure generator 140 extrudes a surface region of the legacy device model 125 along an extrusion direction. First, the surface region engine 420 sets the extrusion direction equal to the average orientation of the actuators 164 and the sensors 162. Subsequently, the surface region engine 420 computes a convex hull mesh 425 based on the actuators 164 and the sensors 162. As persons skilled in the art will recognize, the faces inside the convex hull mesh 425 define the minimal surface region that, after extrusion, encloses the actuators 164 and the sensors 162.

In operation, for each of the actuators 164 and the sensors 162, the surface region engine 420 projects a bounding box of the associated component housing model onto the surface of the legacy device model 125 along the extrusion direction to generate a first set of vertices. The surface region engine 420 then samples the surface curvature between each of the actuators 164 and the sensors 162 to generate a second set of vertices. The enclosure generator 125 computes the convex mesh hull 425 based on the first set of vertices and the second set of vertices. The enclosure generator 125 may compute the convex mesh hull 425 in any technically feasible fashion. For example, the enclosure generator 125 could configure OpenSCAD to generate the convex mesh hull 425.

Because the minimal surface region for extrusion defined by the convex hull mesh 425 may be undesirably large, the surface region engine 420 implements algorithms to optionally partition the actuators 164 and the sensors 162 into multiple, separate enclosures 240. For instance, in some embodiments, the enclosure generator 125 may generate one enclosure 240 that attaches to the top of the legacy device 210 and another enclosure 240 that attaches to the left side of the legacy device 210.

The surface region engine 420 may implement any number and type of partitioning algorithms based on any criteria.

For instance, in some embodiments, the surface region engine 420 compares the dimensions of the minimal surface region for extrusion to a predetermined threshold. If the surface region engine 420 determines that a dimension of the minimal surface region for extrusion exceeds the predetermined threshold, then the surface region engine 420 generates one or more multi-enclosure options 412.

More precisely, the surface region engine 420 allocates the retrofit component instances across multiple different enclosures 240 to generate the multi-enclosure options 412. The surface region engine 420 then displays the multi-enclosure options 412 to the user as design alternatives. If the surface region engine 420 determines that the user selects one of the multi-enclosure options 412, then the surface region engine 420 does not generate the enclosure model 145 based on the current convex mesh hull 425. Instead, the enclosure generator 140 recursively executes to generate the multiple enclosures models 145 associated with the selected multi-enclosure option 412.

If the surface region engine 420 determines that none of the dimensions of the minimal surface region for extrusion exceed the predetermined threshold, then the surface region engine 420 smooths and enlarges the convex hull mesh 425 based on a predetermined wall thickness to generate a thickened surface mesh 428. The surface region engine 420 then transmits the thickened surface mesh 428 to the front panel generator 430 and the side generator 440.

The front panel generator 430 extracts the thickened surface region to generate the front panel model 470. Subsequently, the front panel generator 430 performs a Boolean difference operation between the thickened surface mesh 428 and the component housing models that are associated with the retrofit indicators 172 and the retrofit controls 174. In this fashion, the front panel generator 430 provides holes for the physical component housings that are associated with the retrofit indicators 172 and the retrofit controls 174.

Upon receiving the thickened surface mesh 428, the side generator 440 extracts the faces of the portions of the thickened surface mesh 428 that lie within the predetermined wall thickness of the outside of the thickened surface mesh 428. The result of the extraction is side geometry 445. The support structure generator 450 generates support structure geometries that hold the sensors 162 and the actuators 164 at the associated, static positions and orientations. In operation, for each of the sensors 162 and the actuators 164, the support structure generator 450 casts rays from predefined support locations on the associated component housing models toward the side geometry 445. If the support structure generator 450 detects a valid intersection with the side geometry 445, then the support structure generator 450 generates a rigid cylinder geometry along the ray. In this fashion, the rigid cylinder provides support and prevents the sensor 162 or actuator 164 from moving out of alignment with the corresponding legacy interface component.

Finally, the mounting bracket generator 460 generates the mounting bracket model 490 based on the mounting bracket locations 455 that are received from the user via a graphical user interface (GUI). First, the mounting bracket generator 460 aligns a predefined mounting bracket model and the legacy device model 125 based on the mounting bracket locations 455. The mounting bracket generator 460 then performs a Boolean difference between the faces of the predefined mounting bracket model and the legacy device model 125 to generate the mounting bracket model 490. As a result, the feet of the mounting bracket model 490 conform to the surface curvatures of the legacy device model 125 at the mounting bracket locations 455.

Note that the techniques described herein are illustrative rather than restrictive, and may be altered without departing from the broader spirit and scope of the invention. Many modifications and variations on the functionality provided by the enclosure generator 140 will be apparent to those of ordinary skill in the art without departing from the scope and spirit of the described embodiments. For example, in various embodiments, any number of the techniques may be implemented while other techniques may be omitted in any technically feasible fashion.

In general, the techniques described herein may be applied to generate any type of enclosure that houses any number and type of component instances based on models associated with the component instances. For example, in alternate embodiments the enclosure generator 140 may generate the enclosure for a set of component instances that lie within the enclosure based on a model of any target surface instead of the legacy model 210.

In other embodiments, the enclosure generator 230 is configured to generate a remote enclosure that is not attached to the legacy device 210. While the remote enclosure does not include any actuators 164 or sensors 162, the remote enclosure may include any number of retrofit controls 174 and any number of retrofit indicators 172. A remote enclosure may reposition an interface to a more convenient location, introduce new controls, and so forth.

The functionality of the enclosure generator 230 may be implemented and provided in any technically feasible fashion. In alternate embodiments, the enclosure generator 230 is provided as a cloud-based service. For instances, in some embodiments, the enclosure generator 230 may interact with an user via a web page in a web browser, and the enclosure generator 230 may generate the enclosure 240 on processor(s) included in a cloud.

Figure 5:
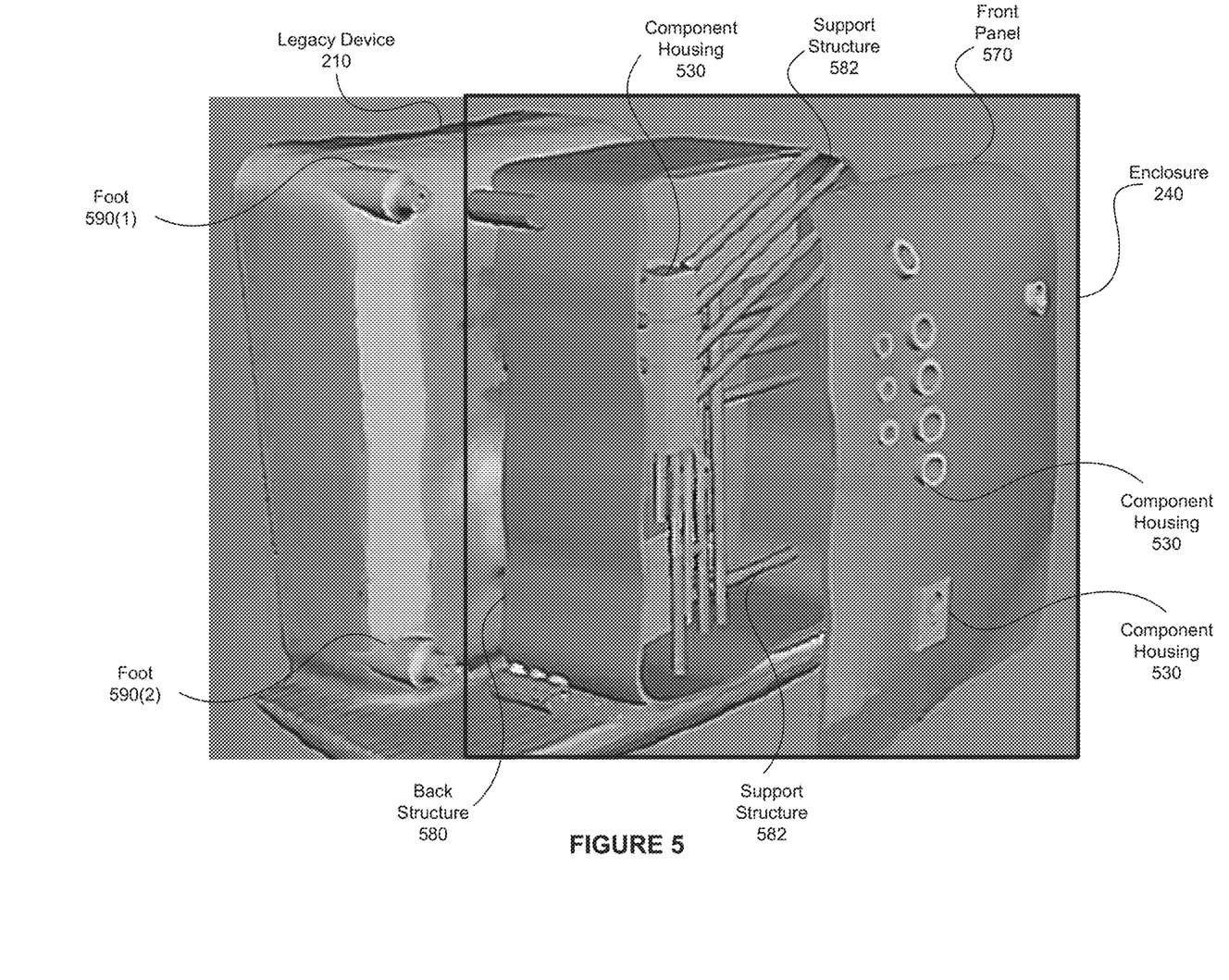
FIG. 5 is an example of an enclosure generated by the enclosure generator of FIG. 4 for a retrofit device, according to various embodiments of the present invention.

FIG. 5 is an example of the enclosure 240 generated by the enclosure generator of FIG. 4 for a retrofit device, according to various embodiments of the present invention. As shown, the enclosure 240 includes, without limitation, a front panel 570, a back structure 580, and feet 590 that are included in a mounting bracket. The front panel 570, the back structure 580, and the mounting bracket are fabricated based on, respectively, the front panel model 470, the back structure model 480, and the mounting bracket model 490.

The front panel 570 includes, without limitation, component housings 530 that are associated with the retrofit indicators 172 and the retrofit controls 174. The front panel 570 is visible to users. The back structure 580 includes, without limitation, component housings 530 that are associated with the sensors 162 and the actuators 184, and support structures 582. The support structures 582 are rigid cylinders that connect the component housings 530 that lie inside the back structure 580 to the side geometry 445. Accordingly, the support structures 582 ensure that the sensors 162 and the actuators 184 remain aligned with the corresponding legacy interface instances. The feet 290 conform to the legacy device 210 to ensure that the physical connection between the enclosure 240 and the legacy device 210 is robust.

To assemble the retrofit device 290, the retrofit components are inserted into the corresponding component housings 530, the front panel 570 and the back structure 580 are glued together, and the back structure 580 is attached to the top of the feet 290 via screws. Finally, the feet 290 are glued to the legacy device 210. Advantageously, the integrated front panel 570 and the back structure 580 may be detached from the legacy device 210 via the screws.

Figure 6:
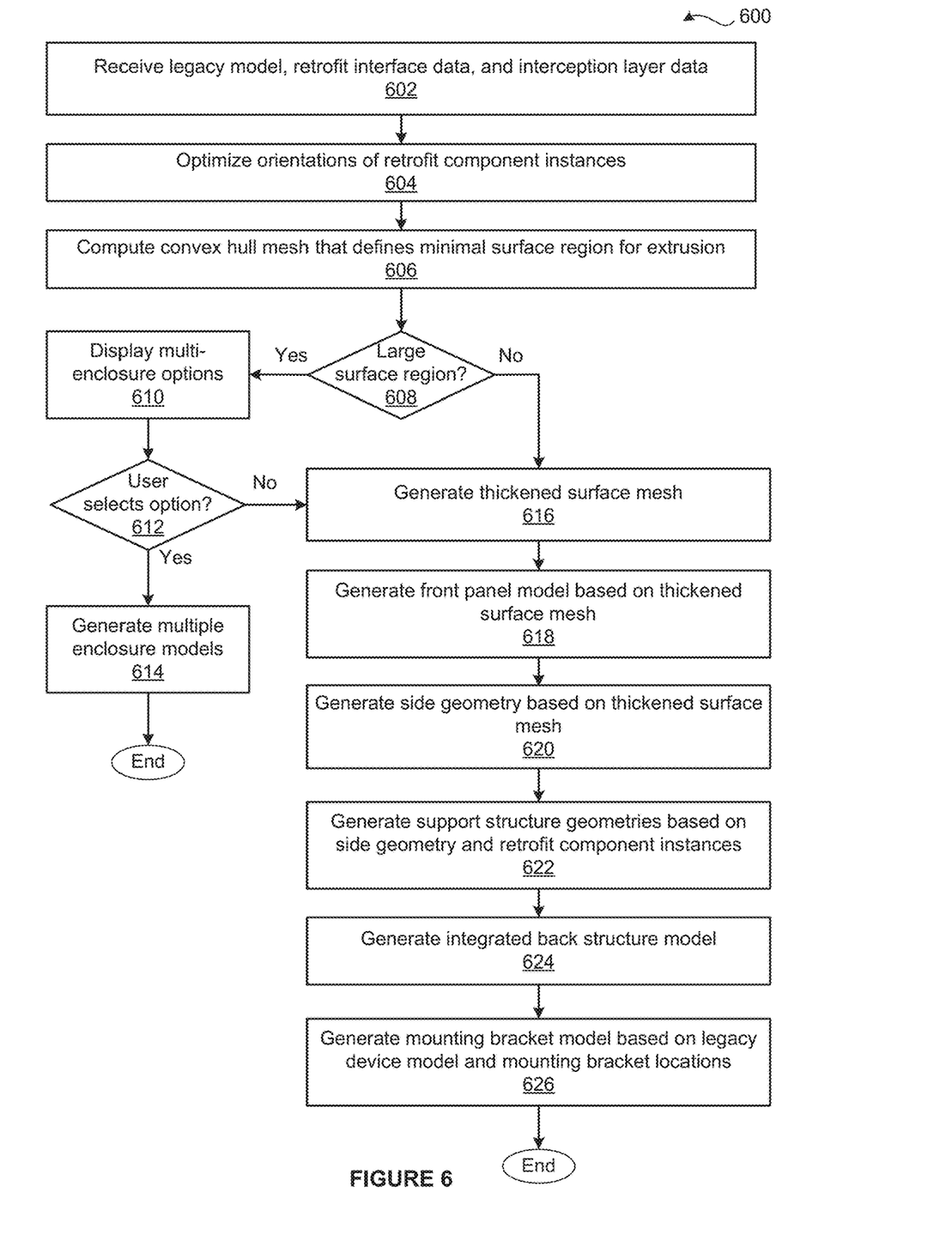
FIG. 6 is a flow diagram of method steps for automatically generating an enclosure for a device, according to various embodiments of the present invention.

FIG. 6 is a flow diagram of method steps for automatically generating an enclosure for a device, according to various embodiments of the present invention. Although the method steps are described with reference to the systems of FIGS. 1-2 and 4-5, persons skilled in the art will understand that any system configured to implement the method steps, in any order, falls within the scope of the present invention. For explanatory purposes only, the method steps are described in the context of enclosure 240 and associated retrofit device 290, as described above in conjunction with FIG. 2. In alternate embodiments, the method steps may be altered to generate any type of physical enclosure for any type of device based on any type of component instances.

As shown, a method 600 begins at step 602, where the enclosure generator 140 receives the legacy device model 125, the interception layer 150, and the retrofit interface 170. As described previously herein, the interception layer 150 and the retrofit interface 170 specify retrofit component instances. Each of the retrofit component instances is associated with a component housing model that is included in the retrofit library 135 and a configuration (i.e., a position and orientation).

At step 604, the orientation optimizer 410 eliminates any overlaps between the actuators 164 and the sensors 162. More precisely, if the orientation optimizer 410 detects one or more overlaps between the component housing models that are associated with the actuators 164 and the sensors 162, then the orientation optimizer 410 attempts to automatically eliminate the overlaps via an orientation optimization process. If the orientation optimizer 410 is unable to automatically eliminate the overlaps, then the orientation optimizer 410 prompts the user to adjust the positions and/or orientations associated with the intersecting retrofit component instances.

At step 606, the surface region engine 420 computes the convex hull mesh 425 based on legacy device model 125, the actuators 164, and the sensors 162. The faces inside the convex hull mesh 425 define a minimal surface region for extrusion. At step 608, the surface region engine 420 determines whether any dimension of the minimal surface region for extrusion exceeds a predetermined threshold. If, at step 608, the surface region engine 420 determines that a dimension of the minimal surface region for extrusion exceeds the predetermined threshold, then the method 600 proceeds to step 610.

At step 610, the surface region engine 420 allocates the retrofit component instances across multiple different enclosures 240 to generate one or more multi-enclosure options 412. The surface region engine 420 then displays the multi-enclosure options 412 to the user as design alternatives. At step 612, the surface region engine 420 determines whether the user selects one of the multi-enclosure options 412. If, at step 612, the surface region engine 420 determines that the user selects one of the multi-enclosure options 412, then the method 600 proceeds to step 614. At step 614, the surface region engine 420 recursively executes to generate the multiple enclosures models 145 associated with the selected multi-enclosure option 412, and the method 600 terminates.

If, however, at step 608, the surface region engine 420 determines that none of the dimensions of the minimal surface region for extrusion exceed the predetermined threshold, then the method 600 proceeds directly to step 616. If, however, at step 612, the surface region engine 420 determines that the user does not select any of the multi-enclosure options 412, then the method 600 proceeds directly to step 616. At step 616, the surface region engine 420 generates the thickened surface mesh 428 based on the convex hull mesh 425 and a predetermined wall thickness.

At step 618, the front panel generator 430 generates the front panel model 470 that is included in the enclosure model 145 based on the thickened surface mesh 428. Subsequently, the front panel generator 430 performs a Boolean difference operation between the thickened surface mesh 428 and the component housing models that are associated with the retrofit indicators 172 and the retrofit controls 174. In this fashion, the front panel generator 430 provides holes for the component housings that are associated with the retrofit indicators 172 and the retrofit controls 174.

At step 620, the side generator 440 generates the side geometry 445 based on the thickened surface mesh 428. At step 622, the support structure generator 450 generates support structure geometries that hold the sensors 162 and the actuators 164 at the associated positions and orientations. At step 624, the support structure generator 450 integrates the support structures 582, the side geometry 445, and the component housing models that are associated with the sensors 162 and the actuators 164 to generate the back structure model 480.

At step 626, the mounting bracket generator 460 generates the mounting bracket model 490 that is included in the enclosure model 145. The mounting bracket generator 460 ensures that the mounting bracket model 490 conforms to the contours of the legacy device model 125 at the mounting bracket locations 455. The method 600 then terminates. Subsequently, the enclosure generator 140 or a user may configure an automated fabrication device to generate the front panel 570, the back structure 580, and a mounting bracket based on the enclosure model 145. Finally, the front panel 570, the back structure 580, and the mounting bracket are assembled to generate the enclosure 240.

In sum, the disclosed techniques may be used to automatically retrofit legacy devices. First, a physical design engine selects retrofit component instances based on a 3D model of a legacy device. More specifically, the physical design engine identifies legacy interface instances based on the 3D model and user input via a physical design GUI. For each legacy interface instance, the physical design engine generates an interception instance and a retrofit interface instance. The interception instance (e.g., an actuator or a sensor) is associated with an interception component and a configuration. Similarly, the retrofit interface instance (e.g., an indicator or a control) is associated with a retrofit interface component and a configuration. Together, the interception instance and the retrofit interface instance serve as a proxy for the legacy interface instance.

An enclosure generator generates an enclosure model that is customized to provide housing and support for the retrofit component instances. The enclosure model specifies a front panel, a back structure, and a mounting bracket. The front panel houses the retrofit interface instances. The back structure houses the interception instances as well as support structures that ensure that each of the interception instances remain aligned to the corresponding legacy interface component. The mounting bracket is designed to mount the enclosure to the legacy device. In general, the enclosure generator may be configured to automatically generate enclosures for any type of device that encloses any number and type of component instances.

Subsequently, the physical design engine performs pin mapping assignment operations that map the control pins of the retrofit component instances to pins of a microcontroller. The physical design engine generates microcontroller code based on the pin assignments and transmits the microcontroller code to the microcontroller. The physical design engine then generates assembly instructions that specify how to connect the pins of the retrofit component instance to the pins of the microcontroller.

A behavior mapping engine generates a behavior mapping GUI that graphically depicts a retrofit device that includes the enclosure, the retrofit component instances, the legacy device model, and the microcontroller. The behavior mapping engine implements programming-by-demonstration techniques that enable a user to specify retrofit behaviors based on interacting with the graphical depiction of the retrofit device. The mapping engine stores the specified retrofit behaviors as functional rules. While the retrofit device executes, the microcontroller relays the states of the retrofit component instances to an execution engine. The execution engine generates commands based on the states and the functional rules, and transmits the commands to the microcontroller. The microcontroller controls the retrofit component instances based on the commands.

Advantageously, a system that includes the physical design engine, the enclosure engine, the behavior engine, and the execution engine enables users with limited or no knowledge of enclosure design and fabrication, circuit design, and/or programming to effectively retrofit legacy devices. Further, because the system provides an automated design process for designing retrofit devices, the time required to generate a given retrofit device is substantially reduced compared to the time that would be required to generate the retrofit device based on conventional, primarily manual approaches. Finally, the enclosure generation system may be executed as part of many different design flows to reduce the expertise and time required to generate enclosures associated with a wide range of devices.

The descriptions of the various embodiments have been presented for purposes of illustration, but are not intended to be exhaustive or limited to the embodiments disclosed, Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for generating an enclosure for a retrofit device, the method comprising:
computing a surface region of the enclosure for the retrofit device based on a target surface model of a legacy device and one or more component instances within the retrofit device configured to interact with the legacy device, wherein each component instance is associated with a different position within the retrofit device;
generating a front panel model based on the surface region;
generating a back structure model based on the surface region and the one or more component instances, wherein the back structure model includes one or more support structure geometries configured to support the one or more component instances; and storing the front panel model and the back structure model or transmitting the front panel model and the back structure model to a three-dimensional (3D) fabrication device.

2. The computer-implemented method of claim 1, further comprising generating a mounting bracket model based on the target surface model and one or more mounting positions.

3. The computer-implemented method of claim 1, wherein generating the front panel model comprises enlarging the surface region based on a predetermined thickness to generate a first geometry, and generating a 3D model that includes the first geometry.

4. The computer-implement method of claim 1, wherein generating the front panel model comprises:
   enlarging the surface region based on a predetermined thickness to generate a first geometry;
   determining that a first position of a first component instance that is not included in the one or more component instances resides within the first geometry;
   performing a Boolean difference operation between the first component instance and the first geometry to generate a second geometry; and
   generating a 3D model that includes the second geometry.

5. The computer-implemented method of claim 1, wherein generating the back structure model comprises:
   generating a side geometry with a predefined thickness based on the surface region and the one or more component instances;
   generating the one or more support structure geometries based on the side geometry and at least one component instance included in the one or more component instances; and
   generating a 3D model that includes the side geometry and the support structure geometries.

6. The computer-implemented method of claim 5, wherein a first support structure geometry included in the one or more support structure geometries comprises a cylinder that connects a first component instance included in the one or more component instances to the side geometry.

7. The computer-implemented method of claim 5, wherein generating the side geometry comprises generating a boundary geometry based on the surface region, and extruding the boundary geometry along an extrusion direction to encompass the one or more component instances.

8. The computer-implemented method of claim 1, wherein computing the surface region comprises:
   projecting the one or more component instances along an extrusion direction onto the target surface model to generate one or more bounding boxes;
   generating a convex hull based on the one or more bounding boxes; and
   selecting one or more faces inside the convex hull.

9. The computer-implemented method of claim 1, further comprising, prior to computing the surface region:
   computing a preliminary surface region based on the target surface model and a first set of component instances that includes the one or more component instances and at least one other component instance;
   determining that a dimension of the preliminary surface region exceeds a predetermined threshold and, in response, displaying a multi-enclosure option to a user;
   receiving a selection of the multi-enclosure option and, in response, generating an enclosure model based on the target surface model and the at least one other component instance; and
   storing the enclosure model or transmitting the enclosure model to a three-dimensional (3D) fabrication device.

10. One or more non-transitory computer-readable storage media including instructions that, when executed by one or more processing units, cause the one or more processing units to generate an enclosure for a retrofit device by performing the steps of:
    computing a surface region of the enclosure for the retrofit device based on a target surface model of a legacy device and one or more component instances within the retrofit device configured to interact with the legacy device, wherein each component instance is associated with a different position within the retrofit device;
    generating a front panel model based on the surface region;
    generating a back structure model based on the surface region and the one or more component instances, wherein the back structure model includes one or more support structure geometries configured to support the one or more component instances; and
    storing the front panel model and the back structure model or transmitting the front panel model and the back structure model to a three-dimensional (3D) fabrication device.

11. The one or more non-transitory computer-readable storage media of claim 10, further comprising generating a mounting bracket model based on the target surface model and one or more mounting positions.

12. The one or more non-transitory computer-readable storage media of claim 10, wherein generating the front panel model comprises enlarging the surface region based on a predetermined thickness to generate a first geometry, and generating a 3D model that includes the first geometry.

13. The one or more non-transitory computer-readable storage media of claim 10, wherein generating the front panel model comprises:
    enlarging the surface region based on a predetermined thickness to generate a first geometry;
    determining that a first position of a first component instance that is not included in the one or more component instances resides within the first geometry;
    performing a Boolean difference operation between the first component instance and the first geometry to generate a second geometry; and
    generating a 3D model that includes the second geometry.

14. The one or more non-transitory computer-readable storage media of claim 10, wherein generating the back structure model comprises:
    generating a side geometry with a predefined thickness based on the surface region and the one or more component instances;
    generating the one or more support structure geometries based on the side geometry and at least one component instance included in the one or more component instances; and
    generating a 3D model that includes the side geometry and the support structure geometries.

15. The one or more non-transitory computer-readable storage media of claim 14, wherein a first support structure geometry included in the one or more support structure geometries comprises a cylinder that connects a first component instance included in the one or more component instances to the side geometry.

16. The one or more non-transitory computer-readable storage media of claim 14, wherein generating the side geometry comprises generating a boundary geometry based on the surface region, and extruding the boundary geometry along an extrusion direction to encompass the one or more component instances.

17. The one or more non-transitory computer-readable storage media of claim 10, further comprising, prior to computing the surface region, performing one or more rotation operations on a preliminary component instance to generate a first component instance included in the one or more component instances, wherein the one or more rotation operations reduce an overlap between the preliminary component instance and a second component instance included in the one or more component instances.

18. The one or more non-transitory computer-readable storage media of claim 10, wherein a first component instance included in the one or more component instances comprises an actuator or a sensor.

19. A system comprising:
one or more memories storing an enclosure generator containing instructions for generating an enclosure for a retrofit device; and
one or more processors that are coupled to the one or more memories and, when executing the enclosure generator, are configured to:
compute a surface region of the enclosure for the retrofit device based on a target surface model of a legacy device and one or more component instances within the retrofit device configured to interact with the legacy device, wherein each component instance is associated with a different position within the retrofit device;
generate a front panel model based on the surface region;
generate a back structure model based on the surface region and the one or more component instances, wherein the back structure model includes one or more support structure geometries configured to support the one or more component instances; and
store the front panel model and the back structure model or transmit the front panel model and the back structure model to a three-dimensional (3D) fabrication device.

20. The system of claim 19, wherein a first component instance included in the one or more component instances comprises an actuator or a sensor.

\* \* \* \* \*